United States Patent [19]

Leef

[11] Patent Number: 5,187,347
[45] Date of Patent: Feb. 16, 1993

[54] SUSCEPTOR ELECTRODE AND METHOD FOR MAKING SAME

[75] Inventor: Anatoly Leef, Phoenix, Ariz.

[73] Assignee: Motorola, Inc., Schaumburg, Ill.

[21] Appl. No.: 646,128

[22] Filed: Jan. 28, 1991

[51] Int. Cl.[5] ................................................ B23K 9/00
[52] U.S. Cl. ............................... 219/121.52; 219/119; 219/121.48
[58] Field of Search ...................... 219/121.52, 121.48, 219/121.43, 118, 119, 121.36, 75

[56] References Cited

U.S. PATENT DOCUMENTS

| | | | |
|---|---|---|---|
| 2,346,088 | 4/1944 | Shobert, II | 219/119 |
| 3,911,246 | 10/1975 | Drinkard, Jr. | 219/119 |
| 4,495,399 | 1/1985 | Cann | 219/121.52 |
| 4,710,607 | 12/1987 | Wilhelmi et al. | 219/121.52 |

Primary Examiner—Mark H. Paschall
Attorney, Agent, or Firm—Joe E. Barbee

[57] ABSTRACT

A composite electrode (10) that is used for conducting a modulated voltage in a plasma reactor. An electrically conductive non-oxidizing surface and an electrically conductive metal surface are electrically and mechanically joined together by threads (12 and 13) to form a composite electrode (10). The composite electrode (10) is used to make contact between a wafer holder and the plasma reactor when the wafer holder is at rest in a chamber of the reactor.

7 Claims, 1 Drawing Sheet

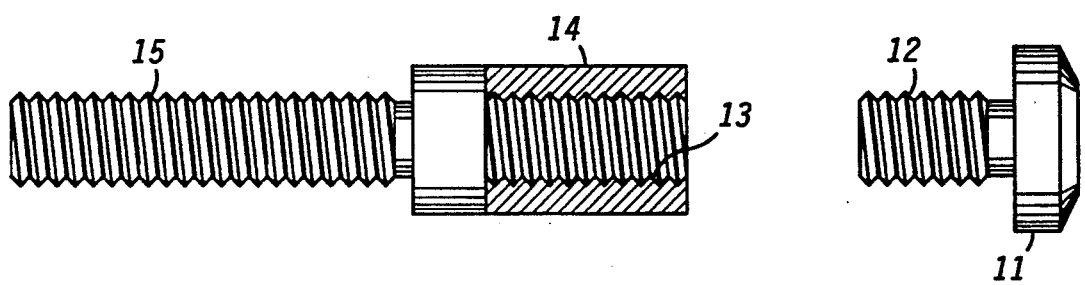
10

SUSCEPTOR ELECTRODE AND METHOD FOR MAKING SAME

BACKGROUND OF THE INVENTION

This invention relates, in general, to electrodes and more particularly to electrodes used for any frequency connections in plasma reactors.

Electrodes have been used for conducting any frequency or modulated voltages in reactors for quite some time. Generally, the electrodes that are constructed for this purpose are made of graphite material such as DFP-2POCO, or the like. Electrodes are generally used to conduct a modulated electrical voltage so that a plasma is generated in a reactor. The plasma is then used in the manufacture of semiconductor devices for either etching, deposition, or a combination of both. Graphite electrodes however have several disadvantages or problems such as material softness, brittleness, and a high incidence of breakage.

Graphite electrodes are generally, formed into a threaded shaft with a button or head on one end of the shaft. The screw threads are used to fasten the electrode into a semiconductor wafer susceptor or boat, while the button forms a contact point between the reactor and the boat. During cleaning of the boat the electrode is unscrewed from the boat and removed. Removal of the electrode from the boat prevents breaking or damaging of the electrode during the boat cleaning process. However, repeated assembly and disassembly of the electrode from the boat causes the screw threads to wear and to degrade with time. The degradation of the screw threads on the electrode causes contact problems which result in poor plasma uniformity, and in general poor reactor performance. Additionally, contamination of the semiconductor wafer or wafers can also be caused by poor contact problems. Generally, poor contact that results in arcing of a plasma, further results in particles or contamination being generated and deposited on the semiconductor wafer or wafers. The wearing of both the electrode threads and buttons are generally, attributed to the softness of the graphite material. The softness of the graphite material not only contributes to the aforesaid problems but, also causes an additional increase in maintenance time.

It can be seen that conventional graphite electrodes have severe limitations. Therefore, an electrode design that improves electrical contact, decreases maintenance time, decreases particle levels, and reduces cost would be highly desirable.

SUMMARY OF THE INVENTION

The objects and advantages of the present invention are provided by a composite electrode for conducting a modulated voltage. An electrically conductive non-oxidizing surface and a electrically conductive metal surface are mechanically joined together by screw threads to form a composite electrode.

BRIEF DESCRIPTION OF THE DRAWING

A single drawing illustrates, in an exploded view, a cross-sectional view of a composite electrode in accordance with the present invention.

DETAILED DESCRIPTION OF THE DRAWING

A single drawing illustrates, in an exploded view, a cross-section of a composite electrode 10. Composite electrode 10 is used for conducting a modulated voltage from a contact point or points to a susceptor or boat. The susceptor or boat is made so that either a single semiconductor wafer or a plurality of semiconductor wafers is held by the susceptor or boat, respectively. Typically, the modulated voltage is created in a radio frequency generator which is connected to a reaction chamber by button contacts. The modulated voltage is generally passed through the reaction chamber by the button contacts to an electrode or electrodes 10. Composite electrode 10 receives the modulated voltage through button contact 11 and conducts the modulated voltage through threads 15 to the susceptor or boat. Typically, a plasma is generated so that the plasma can interact with the semiconductor wafer or wafers.

Head or button 11 and screw threads 12 are milled from a single piece of electrically conductive non-oxidizing material such as graphite, silicon carbide, or the like. Button 11 generally forms a contact surface where a modulated voltage is applied to electrode 10. Typically, contact between button 11 and a source of the modulated voltage is accomplished by having button 11 and the source of the modulated voltage pushed together to make physical contact and are held in contact by gravity. By using electrically conductive non-oxidizing materials, for button 11 and threads 12, it is possible to make repeated electrical and mechanical contact on button 11 in an oxidizing atmosphere that is often found in many reactors. Screw threads 12 are made so that they are screwed into threads 13.

Shaft 14, threads 13, and threads 15 are generally, made from an electrically conductive metal or metal alloy source. In a preferred embodiment, metals that exhibit a slow oxidation rate are used such as nickel alloys or other suitable materials. Screw threads 13 are made so as to receive screw threads 12.

Mating threads 13 and 12 together joins the electrically conductive metallic portion and the electrically conductive non-oxidizing portion together to form composite electrode 10. By screwing threads 12 and 13 together, a good electrical and mechanical connection is formed between the electrically conductive metallic portion and the electrically conductive non-oxidizing portion.

By having shaft 14, threads 13, and threads 15 constructed from a metal or metal alloy a more permanent mounting of these parts into the boat is achieved. Removal of shaft 14, threads 13, and threads 15 from the boat is not necessary except in catastrophic circumstances such as dropping the boat. Thus, a more permanent placement of shaft 14, threads 13, and threads 15 results in superior electrical and mechanical contact between threads 15 and the boat. Additionally, since removal of shaft 14, threads 13, and threads 15 is rare, contact between the boat and the metal portion is more consistent for longer periods of time. This superior electrical and mechanical contact results in improved performance of process parameters such as improved uniformity and fewer contamination particles. It should be understood that long term improvement in process parameters is due to a superior conduction path between threads 15 and the boat that does not wear or change with time.

Required cleaning of the boat is greatly simplified since it is not necessary to remove composite electrode 10 when cleaning the boat. This feature decreases maintenance time that would normally be spent in disassembly, reassembly, and adjustment with a conventional graphite electrode.

Contact between button 11 and the modulated voltage source is generally physical in nature. The physical nature of the contact results in wearing of button 11 with time. Conventionally, when the button portion of a graphite electrode is worn it is necessary to replace the whole electrode and adjust the graphite electrode for correct positioning. However, as an additional feature of the present invention replacement of worn button 11 is a simplified procedure of unscrewing worn button 11 from shaft 14 and replacing worn button 11 with a new button 11 without any further adjustment. This feature allows for reduced maintenance time and increased time available for productive use of the reactor.

By now it should be appreciated that there has been provided an improved composite electrode for conducting a modulated voltage from button contact through composite electrode 10 to a susceptor or boat.

I claim:

1. A composite electrode for conducting a modulated voltage to a susceptor to generate a plasma discharge in a plasma reactor comprising:
   an electrically conductive non-oxidizing threaded shaft having a button contact on one end of the threaded shaft; and
   an electrically conductive metallic shaft with a first and a second end, the first end having screw threads, and the second end having an opening axially aligned to the center of the shaft, with the screw threads on walls of the opening, wherein the non-oxidizing threaded shaft and the screw threads on walls of the opening are joined by the screw threads, and wherein the first end of the electrically conductive metallic shaft is joined to the susceptor.

2. A composite electrode for conducting a modulated voltage to a susceptor as claimed in claim 1 wherein the electrically conductive non-oxidizing threaded shaft having a button contact on one end of the threaded shaft is graphite and the metallic electrically conductive surface is a nickel alloy.

3. A composite electrode for conducting a modulated voltage to a susceptor as claimed in claim 1 wherein the electrically conductive non-oxidizing threaded shaft having a button contact on one end of the threaded shaft is silicon carbide and the metallic electrically conductive surface is a nickel alloy.

4. A composite susceptor electrode for conducting a modulated voltage from a chamber button contact to the susceptor electrode comprising:
   a metal shaft with a first and a second end, the first end having screw threads, the second end having an opening axially aligned to the center of the shaft, with screw threads on walls of the opening;
   a conductive non-oxidizing portion having a threaded shaft and a contact button, wherein the threaded shaft screws into the threaded opening of the metal shaft forming a composite susceptor electrode; and
   a chamber button contact, where the joined composite susceptor electrode having a susceptor attached contacts the chamber button contact for conducting a modulated voltage from the chamber button contact to the composite susceptor contact.

5. A composite susceptor electrode for conducting a modulated voltage from a chamber button contact to the susceptor electrode as claimed in claim 4 wherein the conductive non-oxidizing portion having a threaded shaft and a contact button is silicon carbide and the metal shaft is a nickel alloy.

6. A composite susceptor electrode for conducting a modulated voltage from a chamber button contact to the susceptor electrode as claimed in claim 4 wherein the conductive non-oxidizing portion having a threaded shaft and a contact button is graphite and the metal shaft nickel alloy.

7. A method for improving contact efficiency of a radio frequency electrode:
   providing an electrically conductive metallic shaft with a first and second end, the first end having screw threads and the second end having an opening axially aligned to the center of the shaft, with screw threads on the opening's walls;
   providing an electrically conductive non-oxidizing shaft having a threaded shaft and a contact button;
   threading the metallic shaft and non-oxidizing shaft together so that a good mechanical and electrical contact is made between the electrically conductive metallic shaft and electrically conductive non-oxidizing materials
   providing a susceptor; and
   threading the first end of the electrically conductive metallic shaft into the susceptor, thereby securing an electrical and mechanical connection between the electrically conductive metal shaft with the electrically conductive non-oxidizing shaft to the susceptor.

* * * * *